US006295193B1

United States Patent
Mercke et al.

(10) Patent No.: US 6,295,193 B1
(45) Date of Patent: Sep. 25, 2001

(54) ELECTRONIC CIRCUIT BOARD, AN ARRANGEMENT COMPRISING AN INSULATING MATERIAL AND AN ELECTRONIC CIRCUIT BOARD

(75) Inventors: Johan Ulf Mercke; Jonas Bengtsson; Stefan Hellström, all of Lund; Michael Kellerman, Åkarp, all of (SE)

(73) Assignee: Telefonaktiebologate LM Ericsson (publ), Stockholm (SE)

( * ) Notice: Subject to any disclaimer, the term of this patent is extended or adjusted under 35 U.S.C. 154(b) by 0 days.

(21) Appl. No.: 09/487,256

(22) Filed: Jan. 19, 2000

(30) Foreign Application Priority Data

Jan. 22, 1999 (SE) .................................. 9900230

(51) Int. Cl.$^7$ ............................................ H05F 3/00
(52) U.S. Cl. .............................................. 361/212
(58) Field of Search .................... 361/212, 213, 361/220

(56) References Cited

U.S. PATENT DOCUMENTS

| | | |
|---|---|---|
| 4,617,605 | 10/1986 | Obrecht et al. . |
| 4,754,880 | * 7/1988 | Tehrani ................................ 206/523 |
| 4,992,340 | 2/1991 | Tidwell et al. . |
| 5,167,326 | * 12/1992 | Murphy ............................... 206/331 |
| 5,206,783 | * 4/1993 | Mori et al. .......................... 361/212 |
| 5,317,476 | * 5/1994 | Wallace et al. ..................... 361/220 |
| 5,818,101 | 10/1998 | Schuster . |
| 5,825,606 | * 10/1998 | Villain et al. ....................... 361/220 |

FOREIGN PATENT DOCUMENTS

| | | |
|---|---|---|
| 0 174 814 | 3/1986 | (EP) . |
| 0 755 178 | 1/1997 | (EP) . |
| 0 871 273 | 10/1998 | (EP) . |
| WO 87/01899 | 3/1987 | (WO) . |
| WO 98/28831 | 7/1998 | (WO) . |

OTHER PUBLICATIONS

Motorola Technical Developments, vol. 20, Oct. 1993, Schaumburg, Illinois, US, Pete Gilmore et al., "Component-less, Electrostatic Discharge Technique" One page.

* cited by examiner

Primary Examiner—Adolf Deneke Berhane
(74) Attorney, Agent, or Firm—Nixon & Vanderhye P.C.

(57) ABSTRACT

An electronic circuit board (6) has a surface. with at least one conducting island (7), and the surface is arranged proximate to a first insulating material (3) having a number of holes (8) which correspond to at least some of the conducting islands (7) and through which the conducting islands (7) may be reached. At an end thereof facing the surface, each hole (9) has an area which is larger than the area of the corresponding conducting island (7). A conducting area (10; 14, 15, 16, 17) adapted to carry off an electrostatic discharge (ESD) is located on the surface proximate to the conducting islands (7) and within the area of the holes (8), and elements (9; 19) of a second insulating material are provided in the holes (8). Thus the electronic circuit board can withstand electrostatic discharges without the circuitry of the board being damaged.

17 Claims, 2 Drawing Sheets

Figure 1:
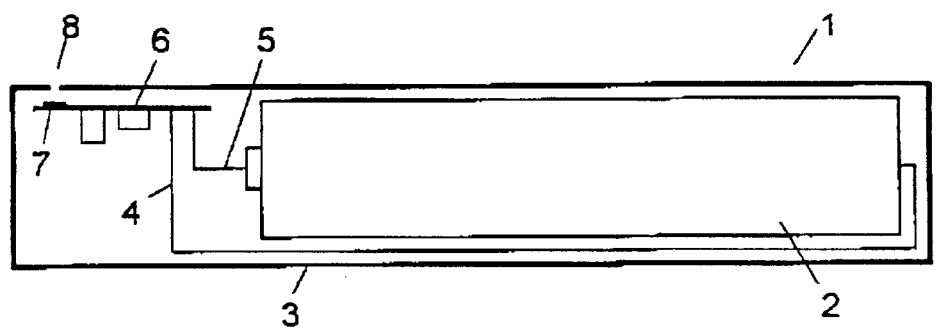

ELECTRONIC CIRCUIT BOARD, AN ARRANGEMENT COMPRISING AN INSULATING MATERIAL AND AN ELECTRONIC CIRCUIT BOARD

The invention relates to an arrangement comprising a first insulating material, and an electronic circuit board having a surface on which at least one conducting island is located, said surface being arranged proximate to the first insulating material, said first insulating material having a number of holes corresponding to at least some of the conducting islands and through which the conducting islands can be reached, each of said holes having, at an end thereof facing said surface, an area which is larger than the area of the corresponding conducting island.

Further, the invention relates to an electronic circuit board therefor.

Such circuit boards and arrangements are used for many purposes. One example is safety electronics circuits for Li-Ion (Lithium-Ion) battery packs, Li-Ion batteries are sensitive to a number of factors, including overcharging. Therefore, all battery pack including one or more Li cells require a safety electronics circuit that can protect the Li cell against critical levels of e.g. charging voltage or charging current.

In the worst case the battery can explode if overcharged and therefore the safety electronics is vital for the safety of battery pack users. Consequently, it is often requested by battery cell vendors to test the safety electronics after the complete pack has been mounted in a production line. This is typically done by attaching probes to test points through holes in the battery pack plastics housing. However, these holes expose sensitive parts of the safety electronics that could be damaged by electrostatic discharges (ESD) after the test has been carried out. Normally, the holes will be sealed after the battery pack has been tested in the production line, but this is often done by a label which can be easily damaged if it comes into contact with a sharp object such as a pencil or a pen. Even with better sealing methods cracks will always be present and thus the risk of damage through ESD remains.

If the safety electronics protecting the Li cell is destroyed by an ESD spark after the test, the result is a battery pack without working safety electronics, and, as mentioned above, in the worst case this may cause an explosion or eruption of the battery cell due to e.g. overcharging of the Li cell.

Although this problem has been described in relation to Li-Ion battery packs, the same problem exists for many other applications in which an electronic circuit can be destroyed by ESD through holes in a surrounding housing.

Therefore, it is an object of the invention to provide an arrangement of the above-mentioned type which can withstand electrostatic discharges without the circuitry of the board being damaged.

In accordance with the invention, this object is accomplished in that a conducting area adapted to carry off an electrostatic discharge (ESD) is located on said surface proximate to the conducting islands and within the area of the holes, and that elements made of a second insulating material are provided in said holes.

When an insulating material is provided in the hole, an ESD spark will strike in between this material and the surrounding material and hit the circuit board underneath. By placing a conducting area within the area of the hole so that it more or less surrounds the conducting island, the spark will hit this area instead of hitting the conducting island which forms part of the sensible circuit, and thus the circuit will be protected.

As stated in claim 2, the arrangement may comprise safety electronics for a battery and the first insulating material may be part of a battery housing. As mentioned above this is one of the typical applications for such a circuit board.

Further, as stated in claim 3, the conducting islands may expediently be test points that are adapted to be used during a test procedure for the circuit board.

As stated in claim 4, the second insulating material may expediently be an elastic material. This implies that the material will be flexible enough to fill out the entire hole and thus minimize the crack between the two materials in which an electrostatic discharge could strike in. Further, the elements can be secured in the hole without the use of any adhesive, which also means that they can easily be removed again, thus allowing further or repeated testing of the circuit at a later stage.

According to an embodiment of the invention, which is stated in claim 5, the conducting area adapted to carry off an electrostatic discharge has the form of a circular ring located around each conducting island. In this way the island is completely surrounded by the conducting area and thus well protected.

According to an alternative embodiment of the invention, which is stated in claim 6, the conducting area adapted to carry off an electrostatic discharge has the form of a number of discrete areas arranged around each conducting island. This is a more flexible solution which still maintains an acceptable level of protection.

Further, it should be noted that the conducting area adapted to carry off an electrostatic discharge may also have other forms.

According to a preferred embodiment of the invention, which is stated in claim 7, the conducting area adapted to carry off an electrostatic discharge is connected to a ground plane. A ground plane will often be best suited to carry off the electrostatic discharge, but depending on the supply voltages the conducting area may also be connected to a positive or negative supply rail.

As stated in claim 8, the conducting area adapted to carry off an electrostatic discharge may have a thickness which is greater than the thickness of said conducting islands. This means partly that the top of the area is closer to the insulating materials, thus improving the probability that an ESD spark will hit this area instead of the island, and partly that the area is able to carry off a higher current in case of a strike.

As stated in claim 9, the probability that an ESD spark will hit the conducting area adapted to carry off an electrostatic discharge instead of the island may be further improved when this area is provided with raised or pointed means. This is due to the fact that electrostatic discharges are attracted to such raised means.

As mentioned, the invention further relates to an electronic circuit board having a surface on which at least one conducting island is located, said surface adapted to be arranged proximate to a first insulating material having a number of holes which correspond to at least some of the conducting islands and through which the conducting islands may be reached, each of said holes having, at an end thereof facing said surface, an area which is larger than the area of the corresponding conducting island, wherein a conducting area adapted to carry off an electrostatic discharge (ESD) is located on said surface proximate to the conducting islands and within the area of the holes.

By placing a conducting area within the area of the hole so that it more or less surrounds the conducting island, the spark will hit this area instead of hitting the conducting island which forms part of the sensible circuit, and thus the circuit will be protected.

As stated in claim 11, the electronic circuit board may comprise safety electronics for a battery and the first insulating material may be part of a battery housing. As mentioned above this is one of the typical applications for such a circuit board.

Further, as stated in claim 12, the conducting islands may expediently be test points that are adapted to be used during a test procedure for the circuit board.

According to an embodiment of the invention, which is stated in claim 13, the conducting area adapted to carry off an electrostatic discharge has the form of a circular ring located around each conducting island. In this way the island is completely surrounded by the conducting area and thus well protected.

According to an alternative embodiment of the invention, which is stated in claim 14, the conducting area adapted to carry off an electrostatic discharge has the form of a number of discrete areas arranged around each conducting island. This is a more flexible solution which still maintains an acceptable level of protection.

Further, it should be noted that the conducting area adapted to carry off an electrostatic discharge may also have other forms.

According to a preferred embodiment of the invention, which is stated in claim 15, the conducting area adapted to carry off an electrostatic discharge is connected to a ground plane. A ground plane will often be best suited to carry off the electrostatic discharge, but depending on the supply voltages the conducting area may also be connected to a positive or negative supply rail.

As stated in claim 16, the conducting area adapted to carry off an electrostatic discharge may have a thickness which is greater than the thickness of said conducting islands. This means partly that the top of the area is closer to the insulating materials, thus improving the probability that an ESD spark will hit this area instead of the island, and partly that the area is able to carry off a higher current in case of a strike.

As stated in claim 17, the probability that an ESD.spark will hit the conducting area adapted to carry off an electrostatic discharge instead of the island may be further improved when this area is provided with raised or pointed means. This is due to the fact that electrostatic discharges are attracted to such raised means.

Figure 2:
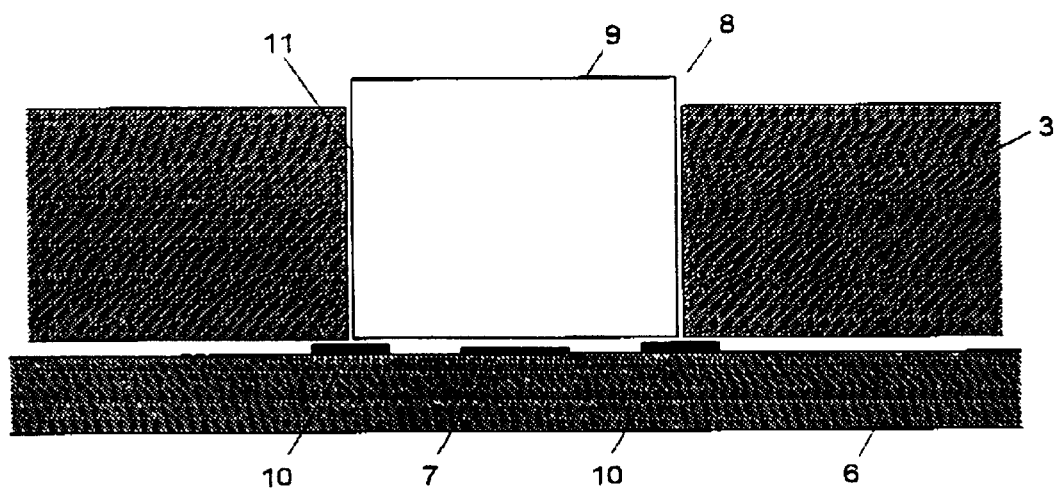
Figure 3:
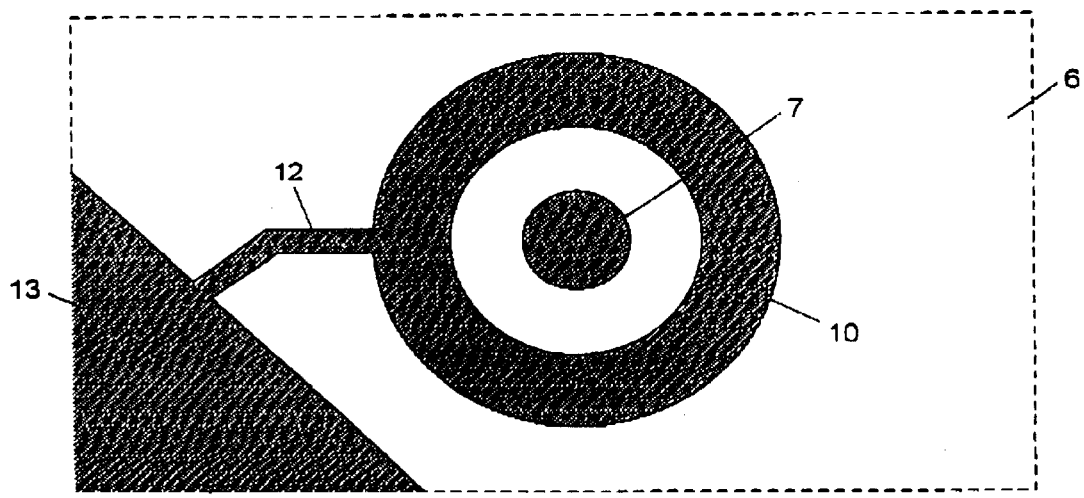
Figure 4:
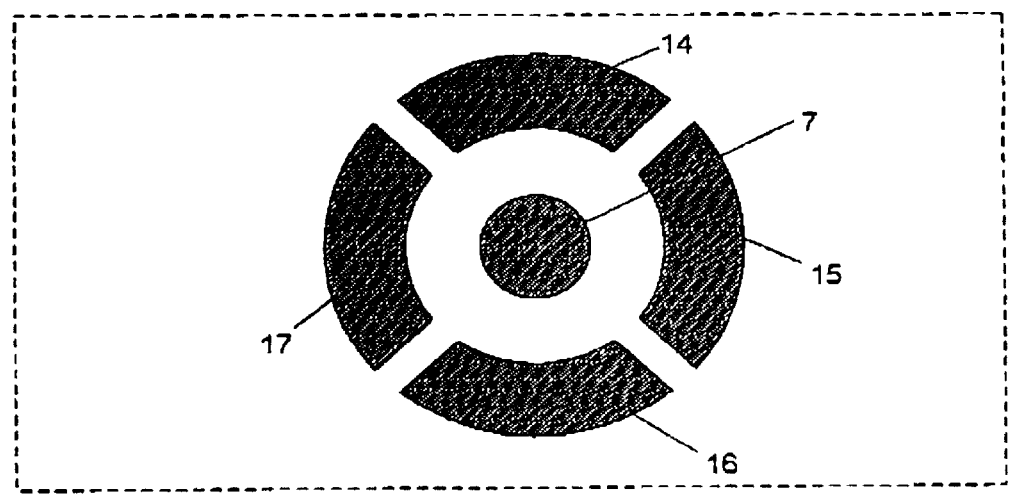
Figure 5:
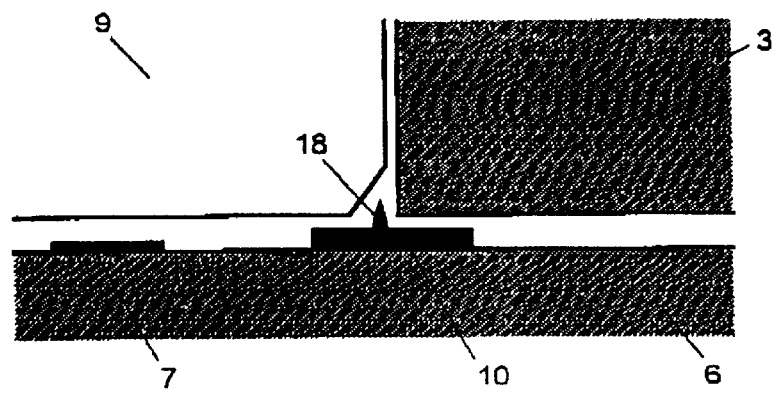
Figure 6:
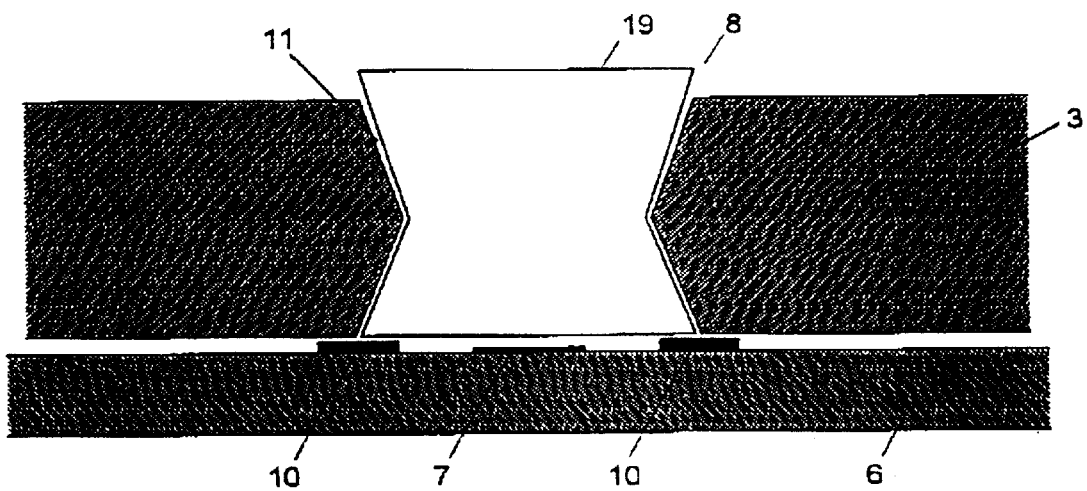

The invention will now be described more fully below with reference to the drawing, in which FIG. 1 shows a battery pack in which the invention may be used, FIG. 2 shows a first embodiment of the invention in sectional view, FIG. 3 shows a printed circuit board of the embodiment of FIG. 2 from above, FIG. 4 shows an alternative embodiment with separate conducting areas, FIG. 5 shows an improvement of the embodiment of FIG. 2, and FIG. 6 shows an alternative embodiment of a plug for use in the invention.

FIG. 1 shows a battery pack 1 in which a Li-Ion battery 2 is enclosed in a plastics housing 3. The poles of the battery is connected through wires 4,5 to a printed circuit board 6 containing a safety electronics circuit adapted to protect the battery 2 against overcharging in the form of e.g. a high voltage or a high charging current. It is often requested that the safety electronics is tested after the mounting of the complete battery pack. Therefore, test points in the form of conducting islands 7 are provided on the printed circuit board 6. For reasons of clarity only one conducting island 7 has been shown, but normally there will be a number of test points. Each test point 7 may be accessed by a probe through a hole 8 in the plastics housing 3 when the test procedure is carried out.

Because of the holes 8, the test points 7 and thus the safety electronics circuit on the printed circuit board 6 are exposed to electrostatic discharges (ESD) which may destroy the circuit. If such a situation occurs, the battery 2 is no longer protected against overcharging and an explosion or eruption of the battery cell may be the result.

FIGS. 2 and 3 show how this problem can be solved. It is seen that the test point 7 on the printed circuit board 6 is placed underneath the hole 8 in the plastics housing 3. A plug 9 made of an insulating material such as rubber has been inserted into the hole 8. Although the plug 9 fills up the hole 8 completely, small cracks 11 will be left between the plug 9 and the edge of the hole 8. A conducting area 10 in the form of a circular ring is placed on the printed circuit board 6 below the border line between the plug 9 and the plastics housing 3. If an electrostatic discharge strikes in through the crack 11, it will hit the conducting area 10 instead of the test point 7. As shown in FIG. 3, the conducting area 10 is connected through the conductor 12 to a ground plane 13, and an ESD that hits the area 10 will thus pass through the conductor 12 to the ground plane 13 without disturbing the test point 7.

Although the hole 8, and thus the plug 9, will often have a circular cross section, it should be noted that other forms are also possible. Likewise, the ring 10 may also have other forms than the circular form shown in FIG. 3. Typically, it will be adapted to the form of the hole 8.

It should be noted that instead of the ground plane 13 a positive or negative supply rail could also be used depending on the polarity and voltage of the battery 2.

As will be seen in FIG. 2 the plug 9 extends above the level of the surface of the plastics housing 3. This has an additional positive effect. When the battery pack is placed in a device, such as a mobile telephone, the plugs of rubber extending above the plastics surface will support the battery pack mechanically against the device so that it is less sensitive to e.g. vibrations. Another advantage of using a flexible plug 9 of e.g. rubber is that the plug may be removed and the circuit then tested again at a later stage, if needed.

Although the embodiment shown in FIG. 3 is a preferred embodiment, other layouts are possible. An example is shown in FIG. 4 in which the circular ring 10 is replaced by a number of discrete areas 14, 15, 16 and 17. Although not shown, each of these areas must be connected to e.g. the ground plane. These connections need not be placed on the same surface of the board. They may be placed in intermediate layers or on the opposite surface.

As will be seen in FIG. 2, the conducting area 10 is made of a metallic layer which is thicker than the layer of the test point 7 in this embodiment. This improves the probability that an ESD will hit the area 10 instead of the test point 7. This probability may be further improved, as is shown in FIG. 5. Here a raised member 18 is placed on the conducting area 10 and the edge of the plug 9 is adapted thereto. The raised member 18 may have different forms such as e.g. separate spikes or a circular ridge on the conducting area 10.

FIG. 6 shows a further embodiment. Here a different shape of the hole in the plastics housing 3 is used and a plug 19 is adapted accordingly. An advantage of this embodiment is that the plug is fixed better in the hole and the cracks 11 will be even smaller, thus improving the protection. Further, a strike of an ESD, when it hits the conducting area 10, will have a direction away from the island or test point 7.

Although a preferred embodiment of the present invention has been described and shown, the invention is not restricted to it, but may also be embodied in other ways within the scope of the subject-matter defined in the following claims.

What is claimed is:

1. An arrangement comprising a first insulating material (3), and an electronic circuit board (6) having a surface on which at least one conducting island (7) is located, said surface being arranged proximate to the first insulating material (3), said first insulating material (3) having a number of holes (8) corresponding to at least some of the conducting islands (7) and through which the conducting islands (7) can be reached, each of said holes (8) having, at an end thereof facing said surface, an area which is larger than the area of the corresponding conducting island (7), characterized in that a conducting area (10; 14, 15, 16, 17) adapted to carry off an electrostatic discharge (ESD) is located on said surface proximate to the conducting islands (7) and within the area of the holes (8), and that elements (9; 19) made of a second insulating material are provided in said holes (8).

2. An arrangement according to claim 1, characterized in that it comprises safety electronics for a battery (2) and that said first insulating material (3) is part of a battery housing.

3. An arrangement according to claim 1, characterized in that said conducting islands (7) are test points.

4. An arrangement according to claim 1, characterized in that said second insulating material is an elastic material.

5. An arrangement according to claim 1, characterized in that said conducting area adapted to carry off an electrostatic discharge has the form of a circular ring (10) located around each conducting island (7).

6. An arrangement according to claim 1, characterized in that said conducting area adapted to carry off an electrostatic discharge has the form of a number of discrete areas (14, 15, 16, 17) arranged around each conducting island (7).

7. An arrangement according to claim 1, characterized in that said conducting area (10; 14, 15, 16, 17) adapted to carry off an electrostatic discharge is connected to a ground plane (13).

8. An arrangement according to claim 1, characterized in that said conducting area (10; 14, 15, 16, 17) adapted to carry off an electrostatic discharge has a thickness which is greater than the thickness of said conducting islands (7).

9. An arrangement according to claim 1, characterized in that said conducting area (10; 14, 15, 16, 17) adapted to carry off an electrostatic discharge is provided with raised means (18).

10. An electronic circuit board (6) having a surface on which at least one conducting island (7) is located, said surface adapted to be arranged proximate to a first insulating material (3) having a number of holes (8) which correspond to at least some of the conducting islands (7) and through which the conducting islands (7) may be reached, each of said holes (8) having, at an end thereof facing said surface, an area which is larger than the area of the corresponding conducting island (7), characterized in that a conducting area (10; 14, 15, 16, 17) adapted to carry off an electrostatic discharge (ESD) is located on said surf ace proximate to the conducting islands (7) and within the area of the holes (8).

11. An electronic circuit board according to claim 10, characterized in that it comprises safety electronics for a battery (2).

12. An electronic circuit board according to claim 10, characterized in that said conducting islands (7) are test points.

13. An electronic circuit board according to claim 10, characterized in that said conducting area carry off an electrostatic discharge has the form of a circular ring (10) located around each conducting (7).

14. An electronic circuit board according to claim 10, characterized in that said conducting area adapted to carry off an electrostatic discharge has the form of a number of discrete areas (14, 15, 16, 17) arranged around each conducting island (7).

15. An electronic circuit board according to claim 10, characterized in that said conducting area (10; 14, 15, 16, 17) adapted to carry off an electrostatic discharge is connected to a ground plane (13).

16. An electronic circuit board according to claim 10, characterized in that said conducting area (10; 14, 15, 16, 17) adapted to carry off an electrostatic discharge has a thickness which is greater than the thickness of said conducting islands (7).

17. An electronic circuit board according to claim 10, characterized in that said conducting area (10; 14, 15, 16, 17) adapted to carry off an electrostatic discharge is provided with raised means (18).

* * * * *